United States Patent
Sugiyama et al.

(10) Patent No.: US 10,596,779 B2
(45) Date of Patent: Mar. 24, 2020

(54) COMPOSITE MATERIAL STRUCTURE

(71) Applicant: MITSUBISHI HEAVY INDUSTRIES, LTD., Tokyo (JP)

(72) Inventors: Takushi Sugiyama, Tokyo (JP); Takayuki Shimizu, Tokyo (JP); Toshio Abe, Tokyo (JP)

(73) Assignee: MITSUBISHI HEAVY INDUSTRIES, LTD., Tokyo (JP)

(*) Notice: Subject to any disclaimer, the term of this patent is extended or adjusted under 35 U.S.C. 154(b) by 0 days.

(21) Appl. No.: 15/310,213

(22) PCT Filed: May 20, 2015

(86) PCT No.: PCT/JP2015/064522
§ 371 (c)(1),
(2) Date: Nov. 10, 2016

(87) PCT Pub. No.: WO2015/186526
PCT Pub. Date: Dec. 10, 2015

(65) Prior Publication Data
US 2017/0136728 A1 May 18, 2017

(30) Foreign Application Priority Data
Jun. 4, 2014 (JP) .................. 2014-116041

(51) Int. Cl.
*B32B 9/00* (2006.01)
*B32B 3/28* (2006.01)
(Continued)

(52) U.S. Cl.
CPC .................. *B32B 3/28* (2013.01); *B32B 3/14* (2013.01); *B32B 5/28* (2013.01); *B64D 29/00* (2013.01);
(Continued)

(58) Field of Classification Search
CPC ....... Y10T 428/30; B82Y 30/00; H01L 31/04; H01L 31/24; H01B 1/04; H01B 1/24
(Continued)

(56) References Cited

U.S. PATENT DOCUMENTS 5,466,507 A 11/1995 Darfler
6,399,217 B1 6/2002 Lee et al.
(Continued)

FOREIGN PATENT DOCUMENTS

JP 8-207180 8/1996
JP 9-500840 1/1997
(Continued)

OTHER PUBLICATIONS

Written Opinion of the International Searching Authority dated Aug. 18, 2015 in corresponding International Application No. PCT/JP2015/064522.
(Continued)

*Primary Examiner* — Daniel H Miller
(74) *Attorney, Agent, or Firm* — Wenderoth, Lind & Ponack, L.L.P.

(57) ABSTRACT

This composite material structure is provided with: a first composite member arranged facing a heating element, the first composite member including PAN-based carbon fibers; a second composite member arranged between the heating element and the first composite member, the second composite member including pitch-based carbon fibers; and a cushioning element provided between the first composite member and the second composite member, the cushioning element being joined to each of the first composite member and the second composite member, and having lower rigidity than those of the first composite member and the second composite member. The first composite member is provided so as to be linked to an adjacent structure, while the second (Continued)

composite member and the cushioning element are provided so as to be separated from the structure.

7 Claims, 4 Drawing Sheets

(51) Int. Cl.
    *B32B 3/14*      (2006.01)
    *B64D 29/00*      (2006.01)
    *F01D 25/24*      (2006.01)
    *F02C 7/00*      (2006.01)
    *B32B 5/28*      (2006.01)
    *H05K 7/20*      (2006.01)
    *F28F 21/02*      (2006.01)
    *B82Y 30/00*      (2011.01)

(52) U.S. Cl.
    CPC ............... *F01D 25/24* (2013.01); *F02C 7/00* (2013.01); *F28F 21/02* (2013.01); *H05K 7/20* (2013.01); *B32B 2262/106* (2013.01); *B82Y 30/00* (2013.01); *Y10T 428/30* (2015.01)

(58) Field of Classification Search
    USPC .......................................... 428/408; 165/185
    See application file for complete search history.

(56) References Cited

U.S. PATENT DOCUMENTS

| | | | |
|---|---|---|---|
| 2003/0170440 A1 | 9/2003 | Aoyagi et al. | |
| 2004/0261987 A1* | 12/2004 | Zhang | B82Y 10/00 |
| | | | 165/183 |
| 2005/0255304 A1* | 11/2005 | Brink | B82Y 10/00 |
| | | | 428/209 |
| 2010/0321891 A1 | 12/2010 | Steertwyk et al. | |

FOREIGN PATENT DOCUMENTS

| | | |
|---|---|---|
| JP | 2000-150946 | 5/2000 |
| JP | 2001-168248 | 6/2001 |
| JP | 2001-214702 | 8/2001 |
| JP | 2002-194232 | 7/2002 |
| JP | 2004-19990 | 1/2004 |
| JP | 2011-3904 | 1/2011 |
| JP | 2012-112264 | 6/2012 |

OTHER PUBLICATIONS

Extended European Search Report dated Jan. 2, 2017 in corresponding European Application No. 15803406.6.
International Search Report dated Aug. 18, 2015 in corresponding International Application No. PCT/JP2015/064522.

* cited by examiner

LOAD DIRECTION

LOAD DIRECTION

COMPOSITE MATERIAL STRUCTURE

TECHNICAL FIELD

The present invention relates to a composite material structure which uses different kinds of carbon fibers.

BACKGROUND ART

In the related art, a fiber reinforced plastic honeycomb structure is known in which a first cell wall including pitch-based carbon fibers and a second cell wall including PAN-based carbon fibers are used so as to be selectively and necessarily composited (for example, refer to PTL 1). In addition, PTL 1 discloses that when a fiber reinforced plastic formed of pitch-based carbon fibers and a fiber reinforced plastic formed of PAN-based carbon fibers are compared to each other, the former has higher heat conductivity than the latter while the latter has higher strength than the former.

CITATION LIST

Patent Literature

[PTL 1] Japanese Unexamined Patent Application Publication No. 8-207180

SUMMARY OF INVENTION

Technical Problem

Meanwhile, a composite material structure including a carbon fiber reinforced plastic including pitch-based carbon fibers (hereinafter, referred to as a pitch-based CFRP) and a carbon fiber reinforced plastic including PAN-based carbon fibers (hereinafter, referred to as a PAN-based CFRP) may be provided to face a heating element which emits heat. In this case, in order to prevent heat remaining in the composite material structure, a pitch-based CFRP having high heat conductivity being used as a strengthening member may be considered. In a case where a pitch-based CFRP is used as a strengthening member, the pitch-based CFRP is connected to another adjacent structure. Accordingly, if an external force is applied to the pitch-based CFRP in a state where the pitch-based CFRP is connected to another adjacent structure, the pitch-based CFRP is deformed by the external force. However, since the pitch-based CFRP has a lower fracture strain than a PAN-based CFRP, the pitch-based CFRP is more easily ruptured than a PAN-based CFRP.

In order to prevent rupture due to an external force, the PAN-based CFRP being connected to another structure along with the pitch-based CFRP is considered. If an external force is applied to the PAN-based CFRP and the pitch-based CFRP, the PAN-based CFRP and the pitch-based CFRP are deformed by the external force. In this case, since the pitch-based CFRP is connected to the PAN-based CFRP via another structure, the pitch-based CFRP is deformed according to the deformation of the PAN-based CFRP due to the external force. However, the pitch-based CFRP cannot follow the deformation of the PAN-based CFRP, and is more easily ruptured than the PAN-based CFRP.

Accordingly, an object of the present invention is to provide a composite material structure in which heat can be prevented from remaining in a case where the composite material structure receives heat from a heating element and damage due to an external force can be prevented.

Solution to Problem

According to an aspect of the present invention, there is provided a composite material structure, including: a first composite member which is disposed so as to face a heating element and includes PAN-based carbon fibers; a second composite member which is disposed between the heating element and the first composite member and includes pitch-based carbon fibers; and a cushioning element which is provided between the first composite member and the second composite member, connects the first composite member and the second composite member to each other, and has a lower rigidity than those of the first composite member and the second composite member, in which the first composite member is provided so as to be connected to an adjacent structure while the second composite member and the cushioning element are provided so as to be separated from the structure.

According to this configuration, since the first composite member is formed as a composite member including the PAN-based carbon fibers, the first composite member is a member which is not easily ruptured by an external force. In addition, since the second composite member is formed as a composite member including the pitch-based carbon fibers, the second composite member is a member which has high heat conductivity. Accordingly, in a case where an external force is applied to the first composite member, since the first composite member is not easily ruptured, the first composite member can function as a strengthening member by being provided to be connected to the adjacent structure. In addition, in a case where heat is applied to the second composite member from the heating element, since the second composite member has high heat conductivity, the second composite member can distribute heat or release heat. Accordingly, it is possible to prevent the first composite member and the second composite member from being excessively heated. Here, since the second composite member is provided so as to be separated from the adjacent structure, it is possible to prevent the second composite member from being deformed according to deformation of the first composite member via the structure. In addition, the second composite member is connected to the first composite member via the cushioning element. Here, since the cushioning element has a lower rigidity than those of the first composite member and the second composite member, it is possible to allow relative displacement between the first composite member and the second composite member. Accordingly, since a load generated due to the deformation of the first composite member is transferred to the second composite member via the cushioning element, it is possible to prevent the second composite member from being deformed according to the deformation of the first composite member. Therefore, even in a case where the composite material structure receives heat from the heating element, since the heat of the heating element is appropriately dispersed or released by the second composite material, the heat is prevented from remaining in the composite material structure and the surrounding space, the first composite member functions as a strengthening member, and it is possible to prevent the first composite member and the second composite member from being damaged by an external force.

In addition, preferably, the cushioning element is a corrugated plate member in which valley portions joined to the first composite member and peak portions joined to the second composite member alternate with and are adjacent to each other.

According to this configuration, since the cushioning element is the corrugated plate member, the cushioning element can be configured so as to be easily deformed in a direction in which the peak portions and the valley portions are adjacent to each other.

Moreover, preferably, the cushioning element is a pad member which includes a first joining surface joined to the first composite member and a second joining surface joined to the second composite member.

According to this configuration, since the cushioning element is a pad member, the cushioning element can be simply configured.

Moreover, preferably, the cushioning element is a composite member which includes PAN-based carbon fibers.

According to this configuration, since the cushioning element is a composite member which includes the PAN-based carbon fibers, the first composite member and the cushioning element can have approximately the same strength as each other. In addition, since the cushioning element has approximately the same fracture strain as that of the first composite member, it is possible to prevent rupture between the first composite member and the cushioning element by the first composite member being deformed by an external force.

In addition, preferably, in a facing surface of the first composite member which faces the second composite member, when a direction of a load generated in the first composite member is defined as a load direction, and a predetermined direction crossing the load direction is defined as a non-load direction, in the cushioning element, the PAN-based carbon fibers having the load direction as a fiber direction are smaller than the PAN-based carbon fibers having the non-load direction as a fiber direction.

According to this configuration, it is possible to allow the rigidity of the cushioning element in the load direction to be lower than the rigidity of the cushioning element in the non-load direction. Accordingly, the cushioning element can be configured so as to be more easily deformed in the load direction than in the non-load direction, and the cushioning element can be deformed so as to appropriately follow the deformation of the first composite member by an external force.

Moreover, preferably, in a facing surface of the second composite member which faces the first composite member, when a predetermined direction in which heat received from the heating element is transferred is defined as a heat transfer direction and a predetermined direction crossing the heat transfer direction is defined as a non-heat transfer direction, in the second composite member, the pitch-based carbon fibers having the heat transfer direction as a fiber direction are larger than the pitch-based carbon fibers having the non-heat transfer direction as a fiber direction.

According to this configuration, since it is possible to allow the heat conductivity of the second composite member in the heat transfer direction to be higher than the heat conductivity of the second composite member in the non-heat transfer direction, it is possible to easily release the heat received from the heating element in the heat transfer direction.

Moreover, preferably, the first composite member is formed by quasi-isotropically laminating single-layer sheets configured to include the PAN-based carbon fibers with a direction, in which the first composite member and the second composite member face each other, as a lamination direction.

According to this configuration, the first composite member can be configured to be isotropic in an orthogonal surface orthogonal to the lamination direction. That is, since the first composite member can have uniform strength (tension strength) in the orthogonal surface, the first composite member can appropriately function as a strengthening member which is connected to the structure.

Moreover, preferably, in a facing surface of the first composite member which faces the second composite member, when a direction of a load generated in the first composite member is defined as one load direction and a predetermined direction crossing the one load direction is defined as the other load direction, the second composite member and the cushioning element are divided into a plurality of second composite members and cushioning elements with a predetermined gap therebetween in the other load direction.

According to this configuration, even in a case the first composite member is deformed in the other load direction, since the second composite member and the cushioning element are divided in the other load direction, it is possible to prevent the second composite member from being deformed to follow the deformation of the first composite member.

In addition, preferably, in the cushioning element, the first composite member side is more greatly deformed than the second composite member side.

According to this configuration, since the cushioning element can easily follow the deformation of the first composite member, it is possible to appropriately absorb the deformation of the first composite member side. In addition, since the deformation of the first composite member cannot be easily transferred to the second composite member by the cushioning element, it is possible to decrease relative displacement between the cushioning element and the second composite member side, and it is possible to prevent a portion between the cushioning element and the second composite member from being ruptured.

DESCRIPTION OF EMBODIMENTS

Hereinafter, Examples according to the present invention will be described in detail with reference to the drawings. In addition, the present invention is not limited by Examples. Moreover, components which can be replaced or is easily replaced by a person in the related art, or components which are substantially the same as each other are included in components of Examples described below. Moreover, the components described below are appropriately combined, and in a case where multiple Examples are provided, Examples can be combined.

EXAMPLE 1

Figure 1:
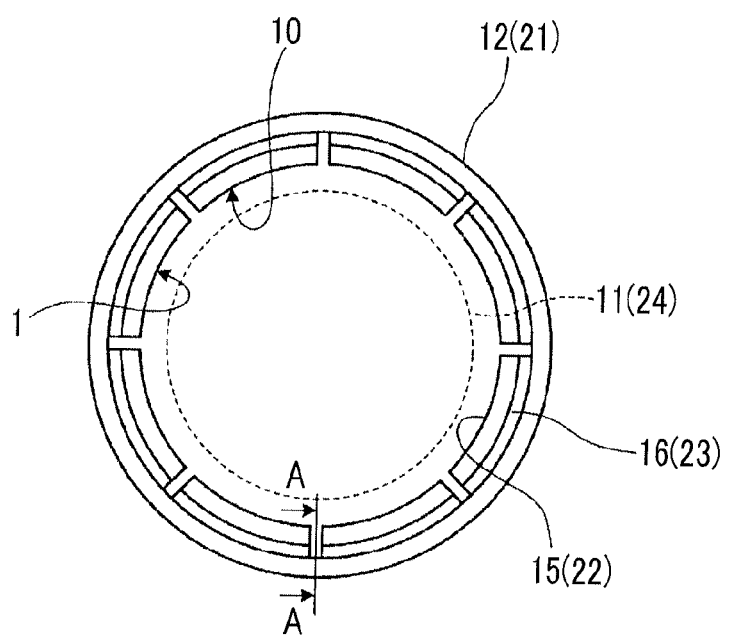
FIG. 1 is a schematic view showing a heat shield to which a composite material structure according to Example 1 is applied.
Figure 2:
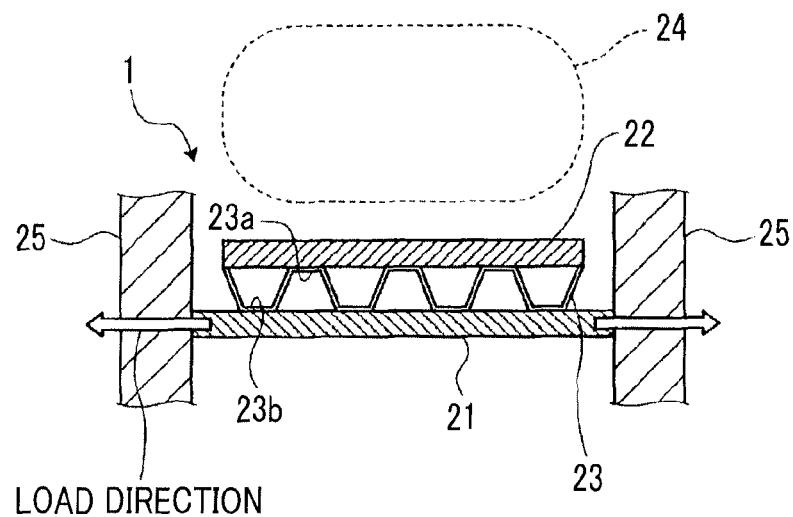
FIG. 2 is a sectional view taken along line A-A of FIG. 1 of the composite material structure according to Example 1.
Figure 3:
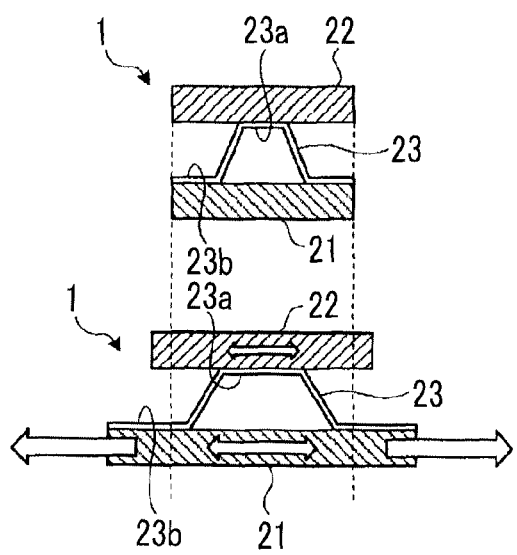
FIG. 3 is an explanatory view showing states before and after the composite material structure according to Example 1 is deformed.

FIG. 1 is a schematic view showing a heat shield to which a composite material structure according to Example 1 is applied. FIG. 2 is a sectional view taken along line A-A of FIG. 1 of the composite material structure according to Example 1. FIG. 3 is an explanatory view showing states before and after the composite material structure according to Example 1 is deformed. In a composite material structure 1 shown in FIGS. 1 to 3, a Carbon Fiber Reinforced Plastic (CFRP) which uses different kinds of carbon fibers is used. The composite material structure 1 can be applied to an aircraft component which configures an aircraft. For example, as the aircraft component, there is a heat shield 10 which is provided inside a nacelle 12, and the composite material structure 1 is a structure which configures the heat shield 10. First, before the composite material structure 1 is described, a structure around the heat shield 10 will be described with reference to FIG. 1.

As shown in FIG. 1, the heat shield 10 decreases heat applied from a gas turbine engine 11 which is mounted on an aircraft to the nacelle 12 so as to protect the nacelle 12 from the heat. The nacelle 12 is configured of a tubular housing, and the gas turbine engine 11 is accommodated inside the nacelle 12. The gas turbine engine 11 is provided inside the nacelle 12 and is a heating element which is operated and emits heat.

The heat shield 10 is provided between the nacelle 12 and the gas turbine engine 11 and is installed on the inner peripheral side of the nacelle 12. The heat shield 10 includes a heat transfer member 15 which is provided on the gas turbine engine 11 side and a connection member 16 which is provided between the nacelle 12 and the heat transfer member 15. Since the heat transfer member 15 transfers heat, which is applied from the gas turbine engine 11 to the heat transfer member 15, in a predetermined heat transfer direction, the heat transfer member 15 disperses the heat or releases the heat. Here, the composite material structure 1 is applied to the nacelle 12, the heat transfer member 15, and the connection member 16. Hereinafter, the composite material structure 1 will be described with reference to FIG. 2.

As shown in FIG. 2, the composite material structure 1 includes a first composite member 21 which is configured to use a carbon fiber reinforced plastic (so-called PAN-based CFRP) including the PAN-based carbon fibers, a second composite member 22 which is configured to use a carbon fiber reinforced plastic (so-called pitch-based CFRP) including pitch-based carbon fibers, and a cushioning element 23 which is provided between the first composite member 21 and the second composite member 22. Since heat is applied from the heating element 24 to the composite material structure 1 and an external force is applied to the composite material structure 1, the first composite member 21 is deformed. In addition, in a case where the composite material structure 1 is applied to the heat shield 10, the first composite member 21 corresponds to the nacelle 12, the second composite member 22 corresponds to the heat transfer member 15, the cushioning element 23 corresponds to the connection member 16, and the heating element 24 corresponds to the gas turbine engine 11.

Here, the pitch-based CFRP and the PAN-based CFRP are compared to each other. Since the PAN-based CFRP has higher fracture strain than that of the pitch-based CFRP, the pitch-based CFRP is weak with respect to the strain while the PAN-based CFRP is strong with respect to the strain. Moreover, since the pitch-based CFRP has higher heat conductivity (thermal conductivity) than that of the PAN-based CFRP, the pitch-based CFRP easily transfers heat while the PAN-based CFRP does not easily transfer heat.

The first composite member 21 is formed in a plate shape and is provided to face the heating element 24. In addition, in a case where the first composite member 21 is applied to the nacelle 12, the first composite member 21 is formed in a plate shape or a tubular shape which is bent. Both end portions of the first composite member 21 in a predetermined direction are respectively connected to both adjacent structures 25. That is, the first composite member 21 is provided between the pair of structures 25 and is connected to the pair of structures 25. Moreover, the first composite member 21 may be connected to other structures in addition to the pair of structures 25.

If an external force is applied to the first composite member 21, the first composite member 21 is deformed in a facing surface which faces the second composite member 22. In this case, in Example 1, a direction of a load generated in the first composite member 21 by an external force is a direction in which the pair of structures 25 faces each other. Here, the external force may be directly applied to the first composite member 21, or the external force may be indirectly applied to the first composite member 21 via the structure 25. In addition, the load direction is not limited to one direction and may be multiple directions. Moreover, in the first composite member 21, a predetermined direction crossing the load direction is a non-load direction. The non-load direction is a direction in which a load which is smaller than the load in the load direction is applied. Accordingly, the first composite member 21 which is deformed by the external force intersects the load direction and the non-load direction in the surface facing the second composite member 22.

Here, since the first composite member 21 used the PAN-based CFRP, the first composite member 21 has higher fracture strain than the second composite member 22 which uses the pitch-based CFRP. Accordingly, since the rupture of the first composite member 21 due to deformation does not more easily occur than the second composite member 22, the first composite member 21 functions as a strengthening member by the first composite member 21 being provided so as to connect the pair of structures 25 to each other.

The second composite member 22 is provided between the first composite member 21 and the heating element 24. Moreover, in FIG. 2, the second composite member 22 is formed in a plate shape. However, the shape of the second composite member 22 is not limited to this shape. In addition, similarly to the first composite member 21, in a case where the second composite member 22 is applied to the heat transfer member 15, the second composite member 22 is formed in a bent shape or a tubular shape. The second composite member 22 is provided such that both end portions of the second composite member 22 respectively face both adjacent structures 25 with a predetermined gap in the load direction of the first composite member 21. That is, the second composite member 22 is provided between the pair of structures 25 and is separated (is not connected to) from the pair of structures 25. In addition, the predetermined gap is a gap by which the second composite member 22 does not physically interfere with the structures 25 when the second composite member 22 is deformed.

Since the predetermined gap is provided to each of portions between the second composite member 22 and the pair of structures 25, the deformation of the first composite member 21 in the load direction is not transferred to the second composite member 22 via the pair of structures 25.

Here, since the second composite member 22 uses the pitch-based CFRP, the second composite member 22 has higher thermal conductivity than that of the first composite member 21 which uses the PAN-based CFRP. Accordingly, since the second composite member 22 more easily transfers heat than the first composite member 21, the second composite member 22 can disperse heat applied from the heating element 24 and can decrease heat applied to the first composite member 21. In addition, a cooling device which is connected to the second composite member 22 may be provided in the second composite member 22, and in this case, the second composite member 22 can release heat applied from the heating element 24 toward the cooling device.

The cushioning element 23 is configured so as to use the PAN-based CFRP, and connects the first composite member 21 and the second composite member 22 to each other. Moreover, the cushioning element 23 is formed to have a lower rigidity than those of the first composite member 21 and the second composite member 22. Accordingly, the cushioning element 23 can allow relative displacement between the first composite member 21 and the second composite member 22.

Specifically, the cushioning element 23 is configured of a corrugated plate member in which peak portions 23a and valley portions 23b alternate with and are adjacent to each other in the load direction. Accordingly, the deformation of the cushioning element 23 in the load direction is more easily performed than the deformation thereof in a direction orthogonal to the load direction. In the cushioning element 23, the valley portions 23b are joined to the first composite member 21, and the peak portions 23a are joined to the second composite member 22. As shown in FIG. 3, if the first composite member 21 is deformed, in the cushioning element 23, deformation amounts of the valley portions 23b on the first composite member 21 side in the load direction are great, and deformation amounts of the peak portions 23a on the second composite member 22 side in the load direction are small. In other words, the deformation amount of the first composite member 21 is greater than that of the second composite member 22.

Here, the first composite member 21 is formed by quasi-isotropically laminating single-layer sheets with a direction, in which the first composite member 21 and the second composite member 22 face each other, as a lamination direction. For example, each of the single-layer sheets is a prepreg in which the fiber directions of the PAN-based carbon fibers are a predetermined direction and a resin such as an epoxy resin is included. In the quasi-isotropic lamination, there are a state of 0° in which the fiber direction of the sheet is the same as the load direction, a state of 45° in which the fiber direction crosses the load direction at 45°, a state of −45° in which the fiber direction crosses the load direction at −45°, and a state of 90° in which the fiber direction is orthogonal to the load direction. In addition, in the quasi-isotropic lamination, the sheets are laminated in the lamination direction such that the number of sheets in the state of 0°, in the state of 45°, in the state of −45°, and in the state of 90° is the same as one another. Accordingly, the first composite member 21 has a configuration having isotropy in the surface orthogonal to the lamination direction, that is, a configuration having uniform strength (tension strength) in the surface orthogonal to the lamination direction.

The second composite member 22 is formed by laminating multiple single-layer sheets in the lamination direction. For example, each of the single-layer sheets is a prepreg in which the fiber directions of the pitch-based carbon fibers are a predetermined direction and a resin such as an epoxy resin is included. In addition, the pitch-based carbon fibers use continuous fibers. Accordingly, it is possible to increase heat conductivity. Here, in a facing surface of the second composite member 22 facing the first composite member 21, a predetermined direction in which heat received from the heating element 24 is released is defined as a heat transfer direction, and a direction orthogonal to the heat transfer direction is defined as a non-heat transfer direction. In this case, in the second composite member 22, multiple single-layer sheets are laminated in the lamination direction such that the number of sheets having the heat transfer direction as a fiber direction is more than the number of sheets having the non-heat transfer direction as a fiber direction. Specifically, in a case where the heat transfer direction is the direction orthogonal to the load direction, in the second composite member 22, the sheets are laminated in the lamination direction such that the sheets in the state of 90° in which the fiber direction is orthogonal to the load direction increase and the sheets in the state of 0° in which the fiber direction is the same as the load direction decreases. Accordingly, the second composite member 22 is configured so as to easily transfer heat in the heat transfer direction and to not easily transfer heat in the non-heat transfer direction.

The cushioning element 23 is formed by laminating multiple single-layer sheets in the lamination direction. Similarly to the first composite member 21, each of the single-layer sheets is a prepreg in which the fiber directions of the PAN-based carbon fibers are a predetermined direction and a resin such as an epoxy resin is included. Here, in a case where the cushioning element 23 has a lower rigidity than those of the first composite member 21 and the second composite member 22, the fiber directions of the PAN-based carbon fibers are set to a predetermined direction, fibers having low rigidity among the PAN-based carbon fibers are used, the resin included in the PAN-based carbon fibers has low rigidity, or the content of the PAN-based carbon fibers decreases. Specifically, in a case where the fiber directions of the PAN-based carbon fibers are set to a predetermined direction and the cushioning element 23 has low rigidity, in the cushioning element 23, multiple single-layer sheets are laminated in the lamination direction such that the number of sheets having the load direction as a fiber direction is less than the number of sheets having the non-load direction as a fiber direction. For example, in a case where only the direction in which the pair of structures 25 faces each other is the load direction, since the direction orthogonal to the load direction is the non-load direction, in the cushioning element 23, the sheets are laminated in the lamination direction such that the sheets in the state of 90° in which the fiber direction is orthogonal to the load direction increase and the sheets in the state of 0° in which the fiber direction is the same as the load direction decreases. Moreover, in a case where a direction in which the pair of structures 25 faces each other is one load direction and a direction orthogonal to the one load direction is the other load direction, since the direction which crosses two load directions orthogonal to each other at ±45° is the non-load direction, in the cushioning element 23, the sheets are laminated in the lamination direction such that the number of sheets in the states of 45° and −45° in which the fiber direction crosses the load direction at 45° increases and the number of sheets in the states of 0° and 90° in which the fiber direction is the same as the load direction decreases.

As described above, according to Example 1, since the first composite member 21 uses the PAN-based CFRP, the first composite member 21 cannot be easily ruptured by an external force, and since the second composite member 22 uses the pitch-based CFRP, it is possible to increase the heat conductivity of the second composite member 22. Accordingly, in a case where an external force is applied to the first composite member 21, since the first composite member 21 is not easily ruptured, the first composite member 21 can function as a strengthening member which connects the pair of structures 25 to each other. Moreover, in a case where heat is applied from the heating element 24 to the second composite member 22, since the second composite member 22 has high heat conductivity, the second composite member 22 can disperse heat or release heat. Accordingly, it is possible to prevent the first composite member 21 and the second composite member 22 from being excessively heated. Here, since the second composite member 22 is provided so as to be separated from the adjacent structure 25, it is possible to prevent the second composite member 22 from being deformed to follow the deformation of the first composite member via the structure 25. In addition, since the second composite member 22 is connected to the first composite member 21 via the cushioning element 23, it is possible to allow the relative displacement between the first composite member 21 and the second composite member 22. Accordingly, since the load generated due to the deformation of the first composite member 21 is transferred to the second composite member 22 via the cushioning element 23, it is possible to prevent the second composite member 22 from being deformed to follow the deformation of the first composite member 21. Hereinbefore, even in a case where the second composite member 22 receives heat from the heating element 24, since the heat of the heating element 24 is appropriately dispersed and released by the second composite member 22, heat is prevented from remaining in the composite material structure 1 and the surrounding space, the first composite member 21 functions as a strengthening member, and it is possible to prevent the first composite member 21 and the second composite member 22 from being damaged by the external force.

In addition, according to Example 1, since the cushioning element 23 is configured of a corrugated plate member, the cushioning element 23 is configured so as to be easily deformed in the load direction in which the pair of structures 25 faces each other. Accordingly, the cushioning element 23 is configured so as to easily follow the deformation of the first composite member 21 in the load direction and so as not to easily transfer the deformation to the second composite member 22.

In addition, according to Example 1, since the cushioning element 23 is configured of the PAN-based CFRP, the first composite member 21 and the cushioning element 23 can have approximately the same strength. Moreover, since the cushioning element 23 has approximately the same fracture strain as that of the first composite member 21, it is possible to prevent the portion between the first composite member 21 and the cushioning element 23 from being ruptured by the first composite member 21 being deformed by an external force.

In addition, according to Example 1, the rigidity of the cushioning element 23 in the load direction can be lower than the rigidity of the cushioning element 23 in the non-load direction. Accordingly, the cushioning element 23 can be configured so as to be more easily deformed in the load direction than in the non-load direction, and the cushioning element 23 can be deformed so as to appropriately follow the deformation of the first composite member 21 in the load direction.

Moreover, according to Example 1, since the heat conductivity of the second composite member 22 in the heat transfer direction can be higher than the heat conductivity of the second composite member 22 in the non-heat transfer direction, heat received from the heating element 24 can be easily released in the heat transfer direction.

In addition, according to Example 1, the first composite member 21 can be configured so as to have isotropy in the orthogonal surface orthogonal to the lamination direction. That is, since the first composite member 21 has uniform strength in the orthogonal surface, the first composite member 21 can appropriately function as a strengthening member which is connected to the structures 25.

Moreover, according to Example, 1, the valley portions 23b of the cushioning element 23 on the first composite member 21 side can be more greatly than the peak portions 23a of the cushioning element 23 on the second composite member 22 side. Accordingly, the cushioning element 23 can be configured so as to easily follow the deformation of the first composite member 21, and thus, the cushioning element 23 can appropriately absorb the deformation on the first composite member 21 side. Moreover, since the cushioning element 23 can be configured so as not to easily transfer the deformation of the first composite member 21 to the second composite member 22, it is possible to allow the relative displacement between the cushioning element 23 and the second composite member 22 side, and it is possible to prevent the portion between the cushioning element 23 and the second composite member 22 from being ruptured.

Moreover, Example 1 describes that the composite material structure 1 is applied to the heat shield 10. However, the present invention is not limited to this, and the present invention may be applied to any aircraft component as long as it is an aircraft component which receives heat from the heating element 24. For example, the present invention may be applied to an aircraft component which is disposed so as to face an aircraft electronic component or various system devices subjected to a high temperature.

EXAMPLE 2

Figure 4:
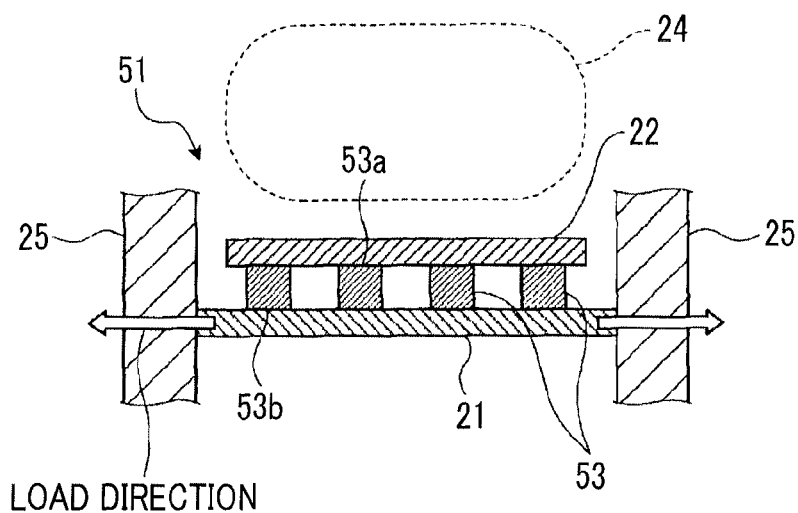
FIG. 4 is a sectional view taken along the line A-A of FIG. 1 of a composite material structure according to Example 2.
Figure 5:
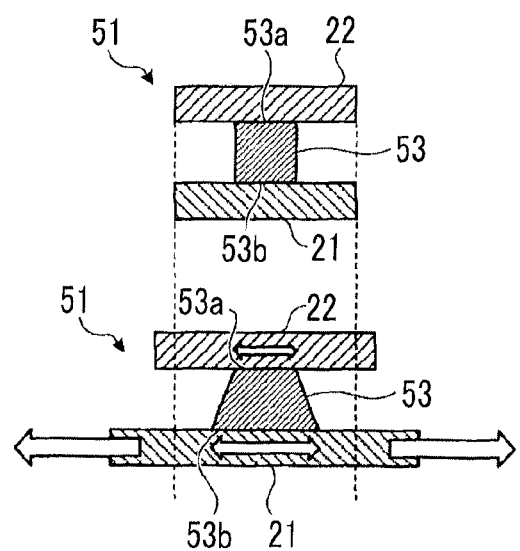
FIG. 5 is an explanatory view showing states before and after the composite material structure according to Example 2 is deformed.

Next, a composite material structure 51 according to Example 2 will be described with reference to FIGS. 4 and 5. FIG. 4 is a sectional view taken along the line A-A of FIG. 1 of the composite material structure according to Example 2. FIG. 5 is an explanatory view showing states before and after the composite material structure according to Example 2 is deformed. Moreover, in Example 2, in order to avoid descriptions overlapping Example 1, only portions different from those of Example 1 are described, and the same reference numerals are assigned to the same portions as those of Example 1. In Example 1, a corrugated member is used as the cushioning element 23. However, in Example 2, a pad member is used as the cushioning element 53. Hereinafter, the composite material structure 51 of Example 2 will be described.

As shown in FIG. 4, the composite material structure 51 includes the first composite member 21 which is configured so as to use the PAN-based CFRP, the second composite member 22 which is configure so as to use the pitch-based CFRP, and the cushioning element 53 which is provided between the first composite member 21 and the second composite member 22. In addition, since the first composite member 21 and the second composite member 22 are similar to those of Example 1, descriptions thereof are omitted.

Similarly to Example 1, the cushioning element 53 is configured so as to use the PAN-based CFRP, connects the first composite member 21 and the second composite member 22, and is formed so as to have a lower rigidity than those of the first composite member 21 and the second composite member 22. Accordingly, the cushioning element 53 can allow relative displacement between the first composite member 21 and the second composite member 22.

Specifically, the cushioning element 53 is a rectangular pad member having the direction orthogonal to the load direction of the first composite member 21 as a longitudinal direction. Multiple cushioning elements 53 are provided with predetermined gaps in the load direction. The surface (lower surface in FIG. 4) of each of the cushioning elements 53 on the first composite member 21 side becomes a first joining surface 53b joined to the first composite member 21, and the surface (upper surface in FIG. 4) thereof on the second composite member 22 side becomes a second joining surface 53a joined to the second composite member 22.

As shown in FIG. 5, if the first composite member 21 is deformed, in the cushioning element 53, a deformation amount in the load direction of the first joining surface 53b on the first composite member 21 side increases, and a deformation amount in the load direction of the second joining surface 53a on the second composite member 22 side decreases.

Similarly to Example 1, the cushioning element 53 is formed by laminating multiple single-layer sheets in the lamination direction. The single-layer sheet is a prepreg in which the fiber directions of the PAN-based carbon fibers are a predetermined direction and a resin such as an epoxy resin is included. Here, in a case where the fiber directions of the PAN-based carbon fibers are set to a predetermined direction and the cushioning element 53 has low rigidity, in the cushioning element 53, multiple single-layer sheets are laminated in the lamination direction such that the number of sheets having the load direction as a fiber direction is less than the number of sheets having the non-load direction as a fiber direction. Moreover, since the lamination of the sheets in the cushioning element 53 is the same as that of Example 1, descriptions thereof are omitted.

As described above, according to Example 2, since the cushioning element 53 is a pad member, the structure is simpler than that of Example 1, and it is possible to easily form the cushioning element 53.

EXAMPLE 3

Figure 6:
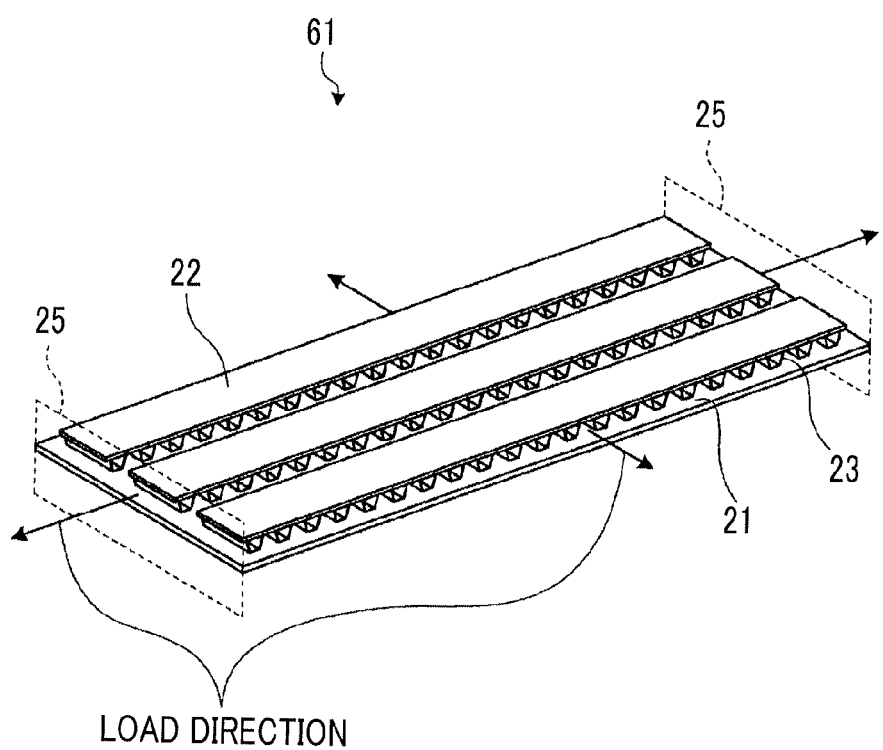
FIG. 6 is an external perspective view of a composite material structure according to Example 3.

Next, a composite material structure 61 according to Example 3 will be described with reference to FIG. 6. FIG. 6 is an external perspective view of the composite material structure according to Example 3. Moreover, in Example 3, in order to avoid descriptions overlapping Example 1, only portions different from those of Example 1 are described, and the same reference numerals are assigned to the same portions as those of Example 1. In Example 3, the second composite member 22 and the cushioning element 23 are divided into multiple second composite members 22 and multiple cushioning elements 23 in the direction orthogonal to the load direction in which the pair of structures 25 faces each other.

As shown in FIG. 6, the composite material structure 61 includes the first composite member 21 which is configured so as to use the PAN-based CFRP, the second composite members 22 which are configured so as to use the pitch-based CFRP, and cushioning members 23 which are provided between the first composite member 21 and the second composite members 22. If an external force is applied to the composite material structure 61, in the load direction generated in the first composite member 21, the direction in which the pair of structures 25 faces each other is one load direction, and the direction orthogonal to the one load direction is the other load direction. That is, in the facing surface of the first composite member 21 facing the second composite member 22, the first composite member 21 is deformed in two load direction orthogonal to each other. Moreover, in a case where the composite material structure 61 shown in FIG. 6 is applied to the heat shield 10 of FIG. 1, the one load direction in which the pair of structures 25 faces each other is the axial direction of the tubular nacelle 12, and the other load direction orthogonal to the one load direction is the circumferential direction of the nacelle 12. Moreover, since the first composite member 21 is that of Example 1, descriptions thereof are omitted.

Each of the second composite members 22 is formed in a plate shape in which the length in the one load direction is long and the length in the other load direction is short. Multiple second composite members 22 are provided so as to be arranged with predetermined gaps in the other load direction. In this case, the gap between second composite members 22 adjacent to each other is set to a gap by which the second composite members 22 do not physically interfere with each other when the second composite members 22 are deformed. In addition, similarly to Example 1, both end portions of the second composite member 22 in the one load direction are respectively provided so as to face each other with predetermined gaps with respect to the both structures 25 adjacent to each other.

The cushioning elements 23 are provided between the first composite member 21 and the multiple second composite members 22. Accordingly, since multiple cushioning elements 23 are provided so as to correspond to the multiple second composite members 22, similarly to the second composite members 22, the multiple cushioning elements 23 are provided so as to be arranged with predetermined gaps in the other load direction. In addition, similarly Example 1, each of the cushioning elements 23 is formed so as to have a lower rigidity than those of the first composite member 21 and the second composite member 22. The cushioning element 23 is a corrugated plate member in which the peak portions 23a and the valley portions 23b alternate with and are adjacent to each other in the one load direction. Accordingly, the deformation of the cushioning element 23 in the one load direction is more easily performed than the deformation thereof in the other load direction.

Therefore, if an external force is applied to the first composite member 21, the first composite member 21 is deformed in the one load direction and the other load direction. In this case, since the second composite members 22 and the cushioning elements 23 are provided with predetermined gaps between the pair of structures 25, a load is not transferred from the first composite member 21 to the second composite members 22 via the pair of structures 25 in the one load direction. In addition, since each of the second composite member 22 and the cushioning element 23 is provided with a predetermined gap between each of the second composite member 22 and the cushioning element 23 and each of another adjacent second composite member 22 and cushioning element 23, it is possible to decrease a load which is applied from the first composite member 21 to each second composite member 22 in the other load direction.

As described above, according to Example 3, even in a case where the first composite member 21 is deformed in the other load direction orthogonal to the one load direction, since the second composite member 22 and the cushioning element 23 are divided into the multiple second composite members 22 and the multiple cushioning elements 23 in the other load direction, it is possible to prevent the second composite members 22 from being deformed to follow the deformation of the first composite member 21.

Moreover, each of Examples 1 to 3 describes the method by which each of the composite members 21 and 22 and each of the cushioning elements 23 and 53 are formed of a prepreg. However, the present invention is not limited to this, and each of the composite members 21 and 21 and each of the cushioning elements 23 and 53 may be molded by a method of injecting a resin into a dry-cross, a method of combining an unwoven fabric resin and carbon fibers so as to be laminated and curved, or the like.

REFERENCE SIGNS LIST

1: composite material structure
10: heat shield
11: gas turbine engine
12: nacelle
15: heat transfer member
16: connection member
21: first composite member
22: second composite member
23: cushioning element
24: heating element
25: structure
51: composite material structure (Example 2)
53: cushioning element (Example 2)
61: composite material structure (Example 3)

The invention claimed is:

1. A composite material structure, comprising:
a first composite member which is disposed so as to face a heating element and includes PAN-based carbon fibers;
a second composite member which is disposed between the heating element and the first composite member and includes pitch-based carbon fibers; and
a cushioning element which is provided between the first composite member and the second composite member, connects the first composite member and the second composite member to each other, and has a lower rigidity than those of the first composite member and the second composite member in a load direction in which a pair of structures face each other,
wherein the first composite member, the cushioning element, and the second composite member are arranged in a first direction, the first direction being orthogonal to the load direction,
wherein the first composite member is provided so as to be connected between the pair of structures adjacent to each other while the second composite member and the cushioning element are provided so as to be separated from, and not connected to, the pair of structures, and
wherein the cushioning element is a corrugated plate member in which valley portions joined in plane contact to the first composite member and peak portions joined in plane contact to the second composite member are alternately adjacent to each other in the load direction.

2. The composite material structure according to claim 1, wherein the cushioning element is a composite member which includes PAN-based carbon fibers.

3. The composite material structure according to claim 2, wherein in a facing surface of the first composite member which faces the second composite member, when a direction of the load generated in the first composite member is defined as the load direction, and a predetermined direction crossing the load direction is defined as a non-load direction,
in the cushioning element, the PAN-based carbon fibers having the load direction as a fiber direction are smaller than the PAN-based carbon fibers having the non-load direction as a fiber direction.

4. The composite material structure according to claim 1, wherein in a facing surface of the second composite member which faces the first composite member, when a predetermined direction in which heat received from the heating element is transferred is defined as a heat transfer direction and a predetermined direction crossing the heat transfer direction is defined as a non-heat transfer direction,
in the second composite member, the pitch-based carbon fibers having the heat transfer direction as a fiber direction are larger than the pitch-based carbon fibers having the non-heat transfer direction as a fiber direction.

5. The composite material structure according to claim 1, wherein the first composite member is configured to include the PAN-based carbon fibers.

6. The composite material structure according to claim 1, wherein in a facing surface of the first composite member which faces the second composite member, when a direction of the load generated in the first composite member is defined as one load direction and a predetermined direction crossing the one load direction is defined as the other load direction,
the second composite member and the cushioning element are divided into a plurality of second composite members and cushioning elements with a predetermined gap therebetween in the other load direction.

7. The composite material structure according to claim 1, wherein the first composite member is deformed upon application of an external force, and deformation amounts of the valley portions of the cushioning element on the first composite member side in the load direction are greater than deformation amounts of the peak portions of the cushioning element on the second composite member side in the load direction.

* * * * *